United States Patent
Charrier et al.

(10) Patent No.: US 9,638,105 B2
(45) Date of Patent: May 2, 2017

(54) TURBINE ENGINE INCORPORATING THERMOELECTRIC GENERATORS

(71) Applicants: LABINAL POWER SYSTEMS, Blagnac (FR); SNECMA, Paris (FR)

(72) Inventors: Jean-Jacques Charrier, La Garenne Colombes (FR); Moez Bensaied, Colombes (FR); Marc Missout, Montigny le Bretonneux (FR); Francis Pottier, Magny les Hameaux (FR); Stephane Ribeiro, Wissous (FR); Romain Tabart, Saint Pierre du Perray (FR)

(73) Assignees: LABINAL POWER SYSTEMS, Blagnac (FR); SNECMA, Paris (FR)

( * ) Notice: Subject to any disclaimer, the term of this patent is extended or adjusted under 35 U.S.C. 154(b) by 201 days.

(21) Appl. No.: 14/396,290

(22) PCT Filed: Apr. 22, 2013

(86) PCT No.: PCT/FR2013/050892
§ 371 (c)(1),
(2) Date: Oct. 22, 2014

(87) PCT Pub. No.: WO2013/160602
PCT Pub. Date: Oct. 31, 2013

(65) Prior Publication Data
US 2015/0082804 A1 Mar. 26, 2015

(30) Foreign Application Priority Data

Apr. 24, 2012 (FR) .................................. 12 53754

(51) Int. Cl.
*F02C 7/18* (2006.01)
*F02C 7/04* (2006.01)
(Continued)

(52) U.S. Cl.
CPC .............. *F02C 7/18* (2013.01); *F01D 25/125* (2013.01); *F02C 7/04* (2013.01); *F02C 7/14* (2013.01);
(Continued)

(58) Field of Classification Search
CPC ...... F02C 7/18; F02C 7/04; F02C 7/14; F02K 3/115; H01L 35/00; H01L 35/02;
(Continued)

(56) References Cited

U.S. PATENT DOCUMENTS

2004/0124308 A1* 7/2004 Daggett ................. B64D 41/00
244/58
2007/0018038 A1 1/2007 Jarmon et al.
(Continued)

FOREIGN PATENT DOCUMENTS

| DE | 10 2007 036 930 | 4/2009 |
|---|---|---|
| DE | 10 2008 055 946 | 5/2010 |
| EP | 1 746 257 | 1/2007 |

OTHER PUBLICATIONS

International Search Report Issued Sep. 10, 2013 in PCT/FR13/050892 Filed Apr. 22, 2013.

*Primary Examiner* — Carlos A Rivera
(74) *Attorney, Agent, or Firm* — Oblon, McClelland, Maier & Neustadt, L.L.P.

(57) ABSTRACT

A front-fan turbojet engine including at least one fluid circuit and an air/fluid heat exchanger by which the fluid is cooled by air external to the turbojet engine and a splitter for splitting a flow downstream of the fan between a primary flow and a secondary flow. The heat exchanger is associated with a thermoelectric generator including a first and a second thermal exchange surface, of which the first surface (Continued)

is in thermal contact with the airflow and the second surface is in thermal contact with the fluid to be cooled in the exchanger.

5 Claims, 1 Drawing Sheet

(51) Int. Cl.
  *F02C 7/14*    (2006.01)
  *H01L 35/30*   (2006.01)
  *F02K 3/115*   (2006.01)
  *F01D 25/12*   (2006.01)
(52) U.S. Cl.
  CPC .............. *F02K 3/115* (2013.01); *H01L 35/30* (2013.01); *F05D 2220/76* (2013.01); *F05D 2260/20* (2013.01); *Y02T 50/671* (2013.01); *Y02T 50/676* (2013.01)
(58) Field of Classification Search
  CPC ......... H01L 35/04; H01L 35/28; H01L 35/30; H01L 35/32; F05D 2220/76; F05D 2260/20
  See application file for complete search history.

(56) References Cited

U.S. PATENT DOCUMENTS

| | | | |
|---|---|---|---|
| 2007/0245738 A1* | 10/2007 | Stretton | F02C 7/141 60/728 |
| 2008/0095611 A1* | 4/2008 | Storage | F01D 25/125 415/116 |
| 2009/0159110 A1 | 6/2009 | Kwok et al. | |
| 2010/0223902 A1* | 9/2010 | Mailander | H05K 7/20445 60/39.83 |
| 2010/0236213 A1* | 9/2010 | Schilling | F01D 25/14 60/39.08 |
| 2012/0118345 A1* | 5/2012 | Stoia | F01D 5/284 136/205 |
| 2013/0205798 A1* | 8/2013 | Kwok | F02K 1/00 60/783 |

* cited by examiner

TURBINE ENGINE INCORPORATING THERMOELECTRIC GENERATORS

The present invention relates to turbine engines used in particular in the aeronautical field for propelling aircraft. More particularly, said invention concerns the application of thermoelectric generators in said turbine engines.

PRIOR ART

Turbine engines, such as turbojet engines, for propelling aircraft are generally multi-shaft and multi-flow turbine engines. The turbojet engine shown in FIG. 1, for example, comprises as a dual-flow engine, from upstream to downstream, a nacelle having an air intake duct which guides the drawn-in air towards a fan rotor 2 downstream thereof and, at a flow splitter 3, the compressed airflow is divided into two concentric, annular flows: a primary, central flow Fp and a secondary flow Fs, which is radially exterior to the primary flow. The secondary flow is guided in a bypass duct 4, straightened at 5 in the axis XX of the engine, so as to be ejected and to produce a significant degree of the thrust of the engine despite not having been heated. In the example in FIG. 1, the primary and secondary flows are ejected separately. The primary flow Fp is guided through the central body 6, which produces the energy required to drive the fan rotor 2. The central body 6 is a gas turbine unit comprising a high- and low-pressure compression region 7 supplying compressed air to a combustion chamber 8 where the fuel is injected and where the engine combustion gases are produced, some of the energy of which is converted by the turbine region 9. The turbine rotors are mechanically connected to the rotors of the compressors, including the fan, and drive them in rotation.

Since weight and fuel consumption are two disadvantageous factors in the aeronautical field, there are constant attempts to reduce the weight of components on the one hand and to utilise the dissipated energy that is not transformed into mechanical energy on the other hand.

Thermoelectric cells are known which, through being arranged between two heat sources having a temperature gradient with one being hot and the other cold, are capable of transforming the thermal energy passing through them into electrical energy.

FIG. 2 shows an example of a thermoelectric cell 10 comprising two semiconductor elements 11 and 12, with an n-type and p-type doping respectively. These two elements are connected at one end by an electrical connection 13 and each terminate at the other end in another electrical connection forming the terminals 14 and 15. The cell is fitted between two electrically insulating but thermally conductive supports 16 and 17. A plurality of cells are combined between the supports 16 and 17, connecting them electrically in series via the terminals 14 and 15; the cells are thus arranged thermally in parallel and form a thermoelectric generator module, referred to hereinafter as "TEG".

Such a TEG module, when installed between two heat sources, one hot at a higher temperature in thermal contact with the support 16 and the other cold at a lower temperature in contact with the other support 17, is able to produce an electric current between the terminals 14 and 15 with the terminals placed in series. The efficiency of the TEG module depends on several factors, including the nature of the materials forming the semiconductors, the number of p-n junctions, their cross section, their geometry, their thickness and, for any given module, the difference in temperature between the heat source and the cold source.

It has already been proposed to utilise the dissipated energy in a gas turbine engine and, more particularly, in a turbojet engine.

For example, the company Turboméca has developed an arrangement of thermoelectric generators in a gas turbine engine propelling an aircraft, which is described in patent application WO 2010/089505. Said arrangement is formed of concentric, annular elements each comprising a plurality of thermoelectric cells. The annular elements create between them cold gas circulation ducts and hot gas circulation ducts. The ducts are also concentric and in communication. A cold fluid sweeps a face of each of the elements and a hot fluid sweeps the opposite face of these elements. The fluids capable of use as either a heat source or cold source respectively may be the fuel of the engine, its cooling or lubricating oil, the outside air, air extracted at the compressor or gases extracted at the gas flow ejected downstream of the turbine.

The electrical energy produced by this device is used to power the engine fittings, such as the FADEC or pumps driven by electrical motors.

DESCRIPTION OF THE INVENTION

The present invention concerns another application of the TEGs in aircraft engines.

Therefore, the invention relates to a front-fan turbojet engine comprising at least one fluid circuit and an air/fluid exchanger by means of which said fluid is cooled by air external to the turbojet engine and a splitter for splitting the flow downstream of the fan between a primary flow and a secondary flow.

The turbojet engine is characterised in that the heat exchanger comprises at least one thermoelectric generator comprising a first and a second thermal exchange surface, of which the first surface is in thermal contact with said airflow and the second surface is in thermal contact with the fluid to be cooled.

The fluid to be cooled, which is mainly oil, comes from the members and pieces of equipment of the engine which dissipate the heat resulting from internal friction and which require lubrication and cooling. They might be, for example, bearing enclosures for the various rotating shafts and gear units for driving auxiliaries.

The considerable temperature gradient between the fluids to be cooled in this manner and the air circulating in the path downstream of the fan also helps, all things being equal, to ensure optimum efficiency of the thermoelectric generators.

The solution provided by the invention therefore makes it possible to help cool these fluids while recovering some of the thermal energy that would otherwise have been lost. The electrical energy produced depends on the surface area of the cold source and is advantageously used to power members such as the actuators of compressor stator vanes of variable geometry arranged between what are known in the field as the "VSV" compressor stages and the bleed, or "VBV", valves of the compressors.

According to one embodiment, said first surface of the thermoelectric generator forms a wall element of the splitter, which element is located downstream of the leading edge of said splitter, on the side of the secondary flow path. If necessary, the first surface of the TEG can be incorporated into the structure of the wall of the nacelle, this being thermally conductive.

Owing to this feature, the arrangement of the invention makes it possible to reduce aerodynamic load losses that may be caused by the elements of the exchanger in contact with the airflow.

In particular, it is advantageous to install the first surface upstream of the fixed guiding fins arranged to straighten the secondary airflow. In fact, there is sufficient space available in this zone defined between the leading edge of the splitter and the guiding fins, referred to as OGV, which stands for "outlet guide vanes".

According to another embodiment, said wall element of the splitter downstream of the edge splitting the airflows comprises radial fins exchanging heat with the secondary airflow.

Although less aerodynamic, this solution allows for increased thermal exchange between the thermodynamic generators and the secondary airflow, when this proves necessary.

BRIEF DESCRIPTION OF THE DRAWINGS

The invention will be better understood, and other objects, details, features and advantages thereof will become clearer in the course of the following detailed explanatory description of an embodiment of the invention given by way of a purely illustrative and non-limiting example, with reference to the appended schematic drawings.

In these drawings.

DETAILED DESCRIPTION OF THE INVENTION

Figure 1:
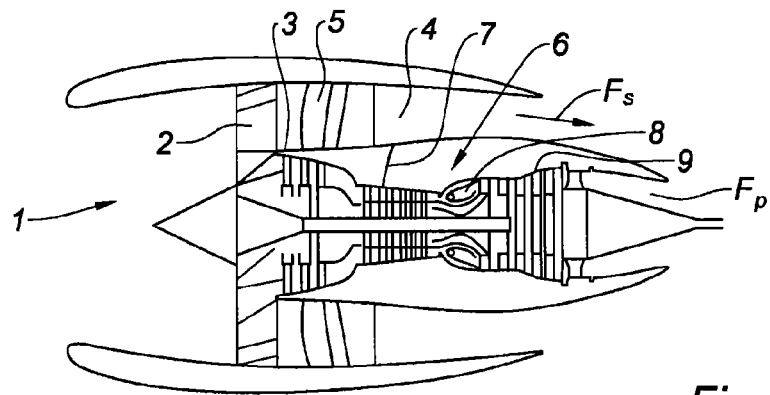
FIG. 1 is a section taken in a plane passing through the axis of the machine of a bypass turbojet engine on which the invention can be carried out.

Referring to FIG. 1, the airflow compressed by the fan 2 is divided into two concentric, annular flows, namely a primary and a secondary flow, as it passes through the flow splitter 3. The primary airflow is thus guided by guiding fins (referred to as "IGV" and not shown) in the central body, and the secondary flow is guided in the cold flow duct delimited between, internally, the casing of the central body and, externally, the fan nacelle.

Figure 3:
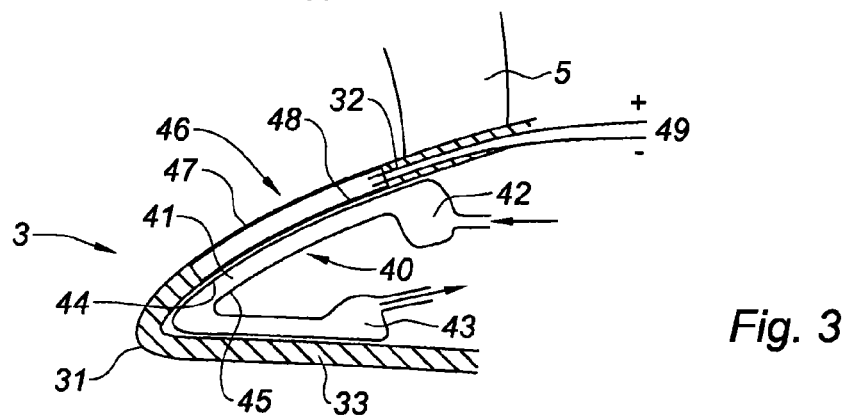
FIG. 3 is a partial cross-sectional view of the splitter of the turbojet engine in FIG. 1 to which, according to the invention, a thermoelectric device is applied.

The annular airflow coming from the fan is divided into two concentric flows by the annular upstream edge of the nacelle of the central body 6, which edge forms the flow splitter 3, shown on a larger scale in FIG. 3.

In a radial plane including the axis XX of the engine, the splitter has a substantially triangular cross section; it comprises a wall portion 32 extending downstream, from the upstream annular edge line forming the leading edge 31. This wall portion radially internally delimits the upstream portion of the secondary flow path. Said portion extends along the secondary flow path after the OGV guiding fins 5, which are arranged to straighten the secondary flow in the axis XX.

From the leading edge 31, the flow splitter comprises a wall portion 33 which radially externally delimits an upstream portion of the primary flow path.

This splitter thus creates a space, between the two wall elements 32 and 33, of sufficient volume to house an air/oil heat exchanger.

FIG. 3 shows an example of an exchanger arrangement which incorporates a thermoelectric generator.

The exchanger 40 comprises an enclosure 41 through which the fluid to be cooled flows and which is arranged between two mutually parallel walls 44 and 45 along the internal face of the wall element 32 of the secondary flow path. The fluid penetrates this enclosure through an inlet 42 in communication with the circuit via a tubular conduit. Formed inside the enclosure 41 is a circuit which ensures optimum heat exchange with the radially external wall 44. The enclosure comprises a fluid outlet 43 which communicates via a tubular conduit with the fluid circuit. The ducts inside the enclosure form, for example, a coil with a main direction that is either axial or peripheral.

Figure 2:
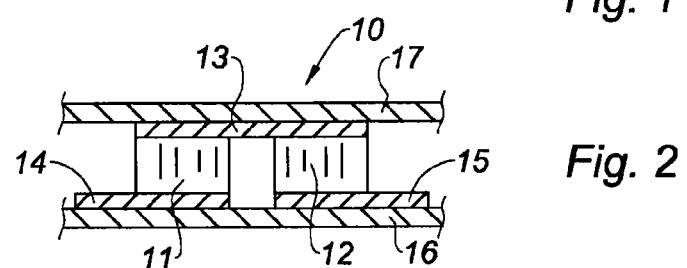
FIG. 2 schematically shows an example of a thermoelectric cell that can be used in the invention.

The radially external wall 44 is in thermal contact with a thermoelectric generator module 46 and forms the heat source thereof. The thermoelectric generator module comprises a plurality of thermoelectric cells, such as those described in relation to FIG. 2, which are fitted between two thermally conductive walls 47 and 48. The wall 48 is in thermal contact with the radially external wall 44 of the enclosure 40 through which the fluid to be cooled passes.

The opposite wall 47 of the TEG module is incorporated into the internal wall 32 of the secondary flow path or is in thermal contact with a wall element forming the nacelle of the central body 6. Said wall is therefore at the temperature of the air of the secondary flow Fs.

The module that is selected depends on the surface area available for installation of the TEGs. The parameters to be taken into account are the materials from which said TEGs are made, the number of p-n junctions, their cross section, their geometry and their thickness. The preferred module is one of which the thermal resistance is as low as possible so as to not reduce the efficiency of the heat exchanger.

As the engine operates when the aircraft is in flight, the difference in temperature between the two walls 47 and 48 creates a difference in potential between the terminals of the semiconductor elements, supplying an electric current. The electric current at 49 can be distributed to the electrically powered members of the turbojet engine.

Figure 4:
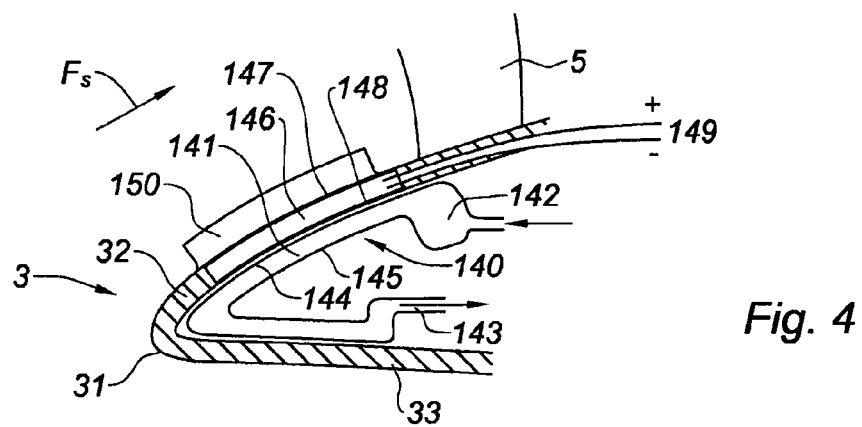
FIG. 4 is a variant on the set-up in FIG. 3.

FIG. 4 shows a variant. The same elements as those in FIG. 3 bear the same reference plus 100.

The heat exchanger 140 comprises a fluid inlet 142 and a fluid outlet 143 between the walls 144 and 145 of the enclosure 141 which is arranged in thermal contact with the thermoelectric generator 146. The hot wall 148 of the TEG 146 is in thermal contact with the wall 144 of the exchanger. The cold wall 147 of the TEG is in thermal contact with fins 150 which extend radially from the wall 32 of the splitter 3.

As previously, the electric current produced by the TEG is collected at lead wire terminals 149 for distribution to the appropriate members.

The invention claimed is:

1. A front-fan turbojet engine comprising:
   at least one fluid circuit and an air/fluid heat exchanger by which fluid is cooled by air external to the turbojet engine; and
   a splitter splitting a flow downstream of a fan between a primary flow and a secondary flow, the splitter presenting a substantially triangular cross section and including an upstream annular edge line forming a leading edge, an outer wall portion extending downstream from the leading edge which radially internally delimits an upstream portion of a flow path of the secondary flow, and an inner wall portion extending downstream from the leading edge which radially externally delimits an upstream portion of a flow path of the primary flow, the outer and inner wall portions delimiting a space in which the heat exchanger is housed, and outlet guide vanes being provided on the outer wall portion, the outlet guide vanes extending radially between the outer wall portion and a casing surrounding blades of the fan, wherein the heat exchanger includes an enclosure through which the fluid to be cooled flows, the enclosure being arranged between two mutually parallel walls along an internal surface of the outer wall portion and an internal surface of the inner wall portion, wherein the heat exchanger is associated with a thermoelectric generator comprising a first thermal exchange surface and a second thermal exchange surface, of which the first thermal exchange surface is in thermal contact with the secondary flow and the second thermal exchange surface is in thermal contact with one of the walls of the enclosure of the heat exchanger, the first thermal exchange surface forming a wall element of the splitter at an external surface of the outer wall portion of the splitter.

2. The turbojet engine according to claim 1, wherein the first thermal exchange surface is upstream of the outlet guide vane which straightens the secondary flow.

3. The turbojet engine according to claim 1, wherein the wall element of the splitter comprises radial fins exchanging heat with the airflow.

4. The turbojet engine according to claim 2, wherein the wall element of the splitter, comprises radial fins exchanging heat with the airflow.

5. The turbojet engine according to claim 1, wherein the heat exchanger includes an inlet and an outlet for the fluid, the inlet being disposed radially outward of the outlet.

* * * * *